(12) United States Patent
Hudait et al.

(10) Patent No.: US 7,494,911 B2
(45) Date of Patent: Feb. 24, 2009

(54) BUFFER LAYERS FOR DEVICE ISOLATION OF DEVICES GROWN ON SILICON

(75) Inventors: Mantu K. Hudait, Portland, OR (US); Mohamad A. Shaheen, Portland, OR (US); Loren A. Chow, Santa Clara, CA (US); Peter G. Tolchinsky, Beaverton, OR (US); Joel M. Fastenau, Bethlehem, PA (US); Dmitri Loubychev, Bethlehem, PA (US); Amy W. K. Liu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 11/527,785

(22) Filed: Sep. 27, 2006
(Under 37 CFR 1.47)

(65) Prior Publication Data
US 2008/0076235 A1    Mar. 27, 2008

(51) Int. Cl.
*H01L 21/28*   (2006.01)
*H01L 21/20*   (2006.01)
*H01L 21/00*   (2006.01)

(52) U.S. Cl. .................. 438/604; 438/483; 438/46; 438/29; 257/E21.218

(58) Field of Classification Search ............ 438/28, 438/29, 46, 479, 483, 604; 257/E21.218
See application file for complete search history.

(56) References Cited

U.S. PATENT DOCUMENTS

| 6,372,981 B1* | 4/2002 | Ueda et al. ............. 136/261 |
| 7,323,764 B2* | 1/2008 | Wallis ...................... 257/613 |
| 2003/0012249 A1* | 1/2003 | Eisenbeiser ............. 372/96 |
| 2004/0069991 A1* | 4/2004 | Dunn et al. .............. 257/75 |
| 2004/0169180 A1* | 9/2004 | Udagawa .................. 257/79 |

* cited by examiner

*Primary Examiner*—Alexander G Ghyka
*Assistant Examiner*—Seahvosh J Nikmanesh
(74) *Attorney, Agent, or Firm*—Lee & Hayes, PLLC

(57) ABSTRACT

Various embodiments proved a buffer layer that is grown over a silicon substrate that provides desirable isolation for devices formed relative to III-V material device layers, such as InSb-based devices, as well as bulk thin film grown on a silicon substrate. In addition, the buffer layer can mitigate parallel conduction issues between transistor devices and the silicon substrate. In addition, the buffer layer addresses and mitigates lattice mismatches between the film relative to which the transistor is formed and the silicon substrate.

15 Claims, 6 Drawing Sheets

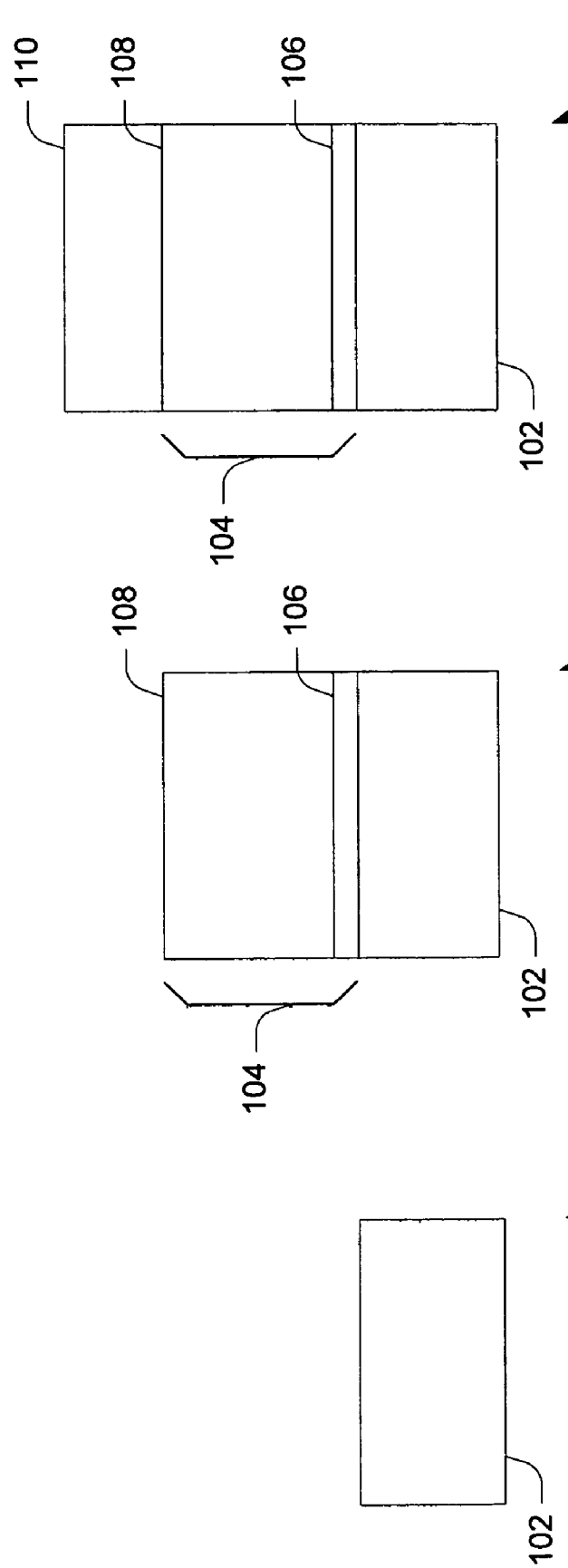

BUFFER LAYERS FOR DEVICE ISOLATION OF DEVICES GROWN ON SILICON

BACKGROUND

One of the challenges device designers face when attempting to form certain types of transistor devices using III-V compound semiconductors (e.g. gallium arsenide (GaAs), indium antimonide (InSb), etc) on a silicon substrate pertains to what is known as parallel conduction in the silicon substrate. Parallel conduction occurs when there are undesirable conduction paths other than between a transistor's source and drain regions, e.g. between the transistor and the silicon substrate. In addition, so-called lattice mismatches between a film of larger lattice constant relative to which the transistor is formed and the silicon substrate can lead to problematic device operation.

BRIEF DESCRIPTION OF THE DRAWINGS

FIG. 1 is a side sectional view of a substrate in process in accordance with one embodiment.

FIG. 2 is a side sectional view of the FIG. 1 substrate in process in accordance with one embodiment.

FIG. 3 is a side sectional view of the FIG. 2 substrate in process in accordance with one embodiment.

DETAILED DESCRIPTION

Figure 5:
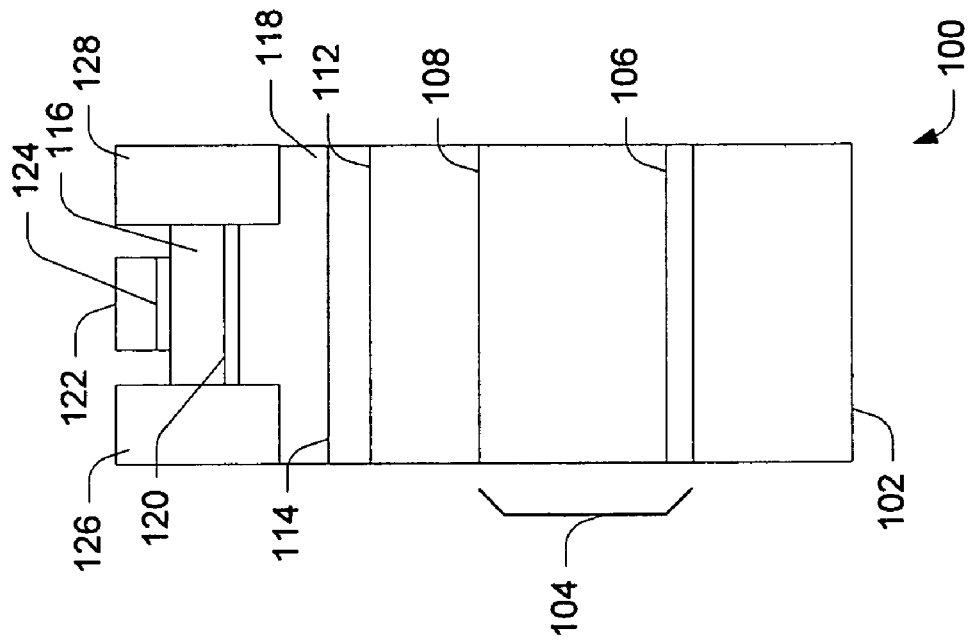
FIG. 5 is a side sectional view of the FIG. 1 substrate having a device structure formed thereon in accordance with one embodiment.

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as CMOS and quantum well (QW) transistors fabricated from extremely high mobility materials such as, but not limited to, indium antimonide (InSb) and indium arsenide (InAs). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by monolithically integrating them with conventional devices of silicon since use of a silicon substrate has the additional advantage of cost reduction.

Despite all these advantages, the growth of III-V materials upon silicon substrates presents many challenges. Crystal defects are generated by lattice mismatch, polar-on-nonpolar mismatch and thermal mismatch between the III-V semiconductor epitaxial layer and the silicon semiconductor substrate. When the lattice mismatch between the epitaxial layer and substrate exceeds a few percent, the strain induced by the mismatch becomes too large and defects are generated in the epitaxial layer by relaxing the epitaxial film. Once the film thickness is greater than the critical thickness (film is strained below this thickness and relaxed above this thickness), the strain is relaxed by creating misfit dislocations at the film and substrate interface as well as in the epitaxial film. The epitaxial crystal defects are typically in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the silicon substrate. For these reasons, the large lattice mismatch (approximately 19.3% between the exemplary InSb and Si combination) typically results in an epitaxial device layer having a high defect density, on the order of $1 \times 10^9$ cm$^{-2}$ to $1 \times 10^{10}$ cm$^{-2}$. The high defect density reduces the carrier mobility theoretically possible in bulk InSb, eliminating many of the technical advantages of "InSb-on-silicon" integration.

Similarly, a high defect density is also detrimental to photonic devices formed in or upon III-V semiconductor device layers on silicon substrates. The recombination-generation (R-G) energies of crystal defects are typically mid-gap, detracting from the performance of a semiconductor device layer that has been band-gap engineered for a particular optical wavelength.

Various embodiments provide a buffer layer that is grown over a silicon substrate that provides desirable device isolation and a strain relief buffer for strain induced by the lattice mismatch between the Si substrate and the III-V device layer. The buffer layer can reduce the detrimental defect density of the device layer for InSb-based devices as well as bulk thin film grown on a silicon substrate. High resistivity ($>10^7$ Ω-cm) Si substrates are not available today and the substrate conduction to the active channel III-V compound semiconductor is not desirable. In addition, the buffer layer can mitigate parallel conduction issues between transistor devices and the silicon substrate. In addition, the buffer layer can also address and mitigate lattice mismatches between a film relative to which the transistor is formed and the starting silicon substrate.

In the illustrated and described embodiment, a buffer layer comprising aluminum arsenide (AlSb) is formed or grown on a silicon substrate and provides a desirable resistive or device isolation layer for InSb-based devices, such as InSb quantum well-based devices. It is to be appreciated and understood that other materials, examples of which are provided above and below, can be utilized without departing from the spirit and scope of the claimed subject matter.

IMPLEMENTATION EXAMPLE

Referring to FIGS. 1 and 2, a substrate in process is shown generally at 100 and comprises a vicinal silicon substrate 102. A III-V material resistive buffer layer 104 is formed or grown over substrate 102 and comprises, in this example, a nucleation layer 106 and an overlying buffer layer 108. In the illustrated and described embodiment, a vicinal substrate surface having double-stepped terraces is utilized and is capable of suppressing anti-phase domains (APDs) formation in the buffer layer 104, as will be appreciated by the skilled artisan. APDs can be created when a first polar crystal domain of layer 106 having group III atoms attached to the nonpolar silicon substrate surface meets a second polar crystal domain of layer 106 having group V atoms attached to the silicon substrate. A crystal discontinuity can then form in layer 106 at the border between these first and second domains providing recombination-generation centers detrimental to the operation of a semiconductor device. By using a vicinal substrate surface having double-stepped terraces, these effects can be mitigated.

The term "polar", as used above, refers to the partially ionic bonding character between the constituents of an III-V compound semiconductor. Anti-phase domains are to be avoided in layer 106 because they can not be eliminated during subsequent epitaxial growth. Once formed, the boundary between the domains of opposite phase merely extends upward through the film as the film thickness is increased or the film composition is changed. Thus, it is important to ensure layer 106 is comprised of a single crystal domain upon the silicon substrate 102.

In the illustrated and described embodiment, substrate 100 comprises an offcut substrate. The degree of offcut can comprise any suitable degree of offcut. One exemplary offcut range can be from between about 2° to 12°. In at least some embodiments, a 6° offcut silicon substrate can be used. One benefit of using an offcut silicon substrate is that doing so mitigates anti-phase domain effects to provide a single-domain material, as described above.

In addition, in the illustrated and described embodiment, the silicon substrate comprises a (100) silicon crystal substrate. Other types of suitable silicon crystal substrates include, by way of example and not limitation, (211), (013), (511), (711) and other high index plan silicon crystal substrates.

Referring to FIG. 2, resistive buffer layer 104 is grown over silicon substrate 102. In this particular example, resistive buffer layer comprises a nucleation layer 106 and an overlying buffer layer 108 as noted above.

In the illustrated and described embodiment, nucleation layer 106 is a thin migration enhanced epitaxial layer or standard molecular beam epitaxial growth process layer. In the illustrated and described embodiment, layer 106 comprises aluminum antimonide (AlSb). Other materials, such as gallium arsenide (GaAs), gallium antimonide (GaSb), indium phosphide (InP) can be used for the nucleation layer. Any suitable formation techniques including but not limited to molecular beam epitaxy (MBE) or metal-organic chemical vapor deposition (MOCVD), atomic layer epitaxy (ALE), chemical beam epitaxy (CBE) can be used. For example, the AlSb layer can be grown by opening sources of Al and Sb in a NMBE reactor under temperature conditions effective to grow the layer. Suitable temperature conditions include, by way of example and not limitation, a temperature range from between about 350° C. to 600° C. In at least one embodiment, nucleation layer 106 was grown at a temperature of about 400° C. to a thickness from between about 150-300 Angstrom.

After the nucleation layer 106 is grown, buffer layer 108 is grown over the nucleation layer. In the example just above where the nucleation layer comprises AlSb, buffer layer 108 can be grown by increasing the temperature in the reactor in the presence of Al and Sb under conditions that are effective to grow the layer. In the illustrated and described embodiment, an epitaxial stoichiometric AlSb buffer layer can be grown by raising the temperature to one in a range from between about 510° C. C to 600° C. for a time period sufficient to recrystallize the nucleation layer and grow the buffer layer in the range of 0.3 micron to 2 micron. Such a layer can provide high resistivity for excellent device isolation and low capacitance. Re-crystallizing the nucleation layer will, in turn, provide a better interface between AlSb and the underlying silicon substrate, as will be appreciated by the skilled artisan.

Referring to FIG. 3, a III-V material device layer 110 of larger lattice constant compared with the buffer layer 104 is grown over resistive buffer 104 and constitutes a portion of a device structure that can be formed on the resistive buffer. In a particular embodiment, III-V buffer layer 104 has a lattice spacing larger than the silicon substrate 102 and the III-V device layer 110 has a lattice spacing larger than the III-V buffer layer 104. In one such an embodiment, an aluminum antimonide (AlSb) layer 104 is formed between the silicon substrate 102 and an indium antimonide (InSb) device layer 110. The 6.13 Å lattice constant of AlSb layer 104 is approximately 12.8% larger than the 5.43 Å lattice constant of the silicon substrate 102 upon which layer 104 is formed. Finally, the 6.48 Å lattice constant of the InSb layer 110 is approximately 5.6% larger than the AlSb layer 104. Thus, in this particular embodiment, the lattice constant of the materials comprising the buffer 104 is gradually incremented from the lattice spacing of the silicon substrate 102 to the lattice spacing of the III-V device layer 110, thereby partitioning the total lattice mismatch between two separate material interfaces. In this manner, the InSb device layer 110 need only accommodate the strain of a 5.6% lattice mismatch with AlSb layer 104 rather than the entire 19.2% mismatch with respect to the silicon substrate 102.

In the illustrated and described embodiment, layer 110 comprises a layer of InSb that is grown over the resistive buffer layer 104. Layer 110 can form the foundation relative to which various InSb-based devices, such as quantum well based transistors, metal insulator field effect transistors (MISFETs) and the like can be grown, as will be appreciated by the skilled artisan. In an alternate embodiment, the III-V buffer layer 104 can be formed of an aluminum gallium antimonide alloy ($Al_xGa_{1-x}Sb$), wherein the Al content ranges from 0.1 to 1.0. In one such embodiment, the III-V buffer layer 104 contains sufficient aluminum for the band gap to be at least approximately 1.4 eV and therefore acts as a resistive buffer. In a specific embodiment, the aluminum (Al) faction, x, is between 0.3 and 0.6. In still other embodiments, III-V buffer layer 104 provides device isolation by being doped to a conductivity type that is complementary to the conductivity type of the devices formed in the III-V device layer 110. Such complementary doping provides junction isolation, as will be appreciated by the skilled artisan. In one such embodiment, the starting Si substrate is p-type, buffer layer 104 is p-type and device layer 110 comprises an n-type quantum well (QW) transistor.

Figure 4:
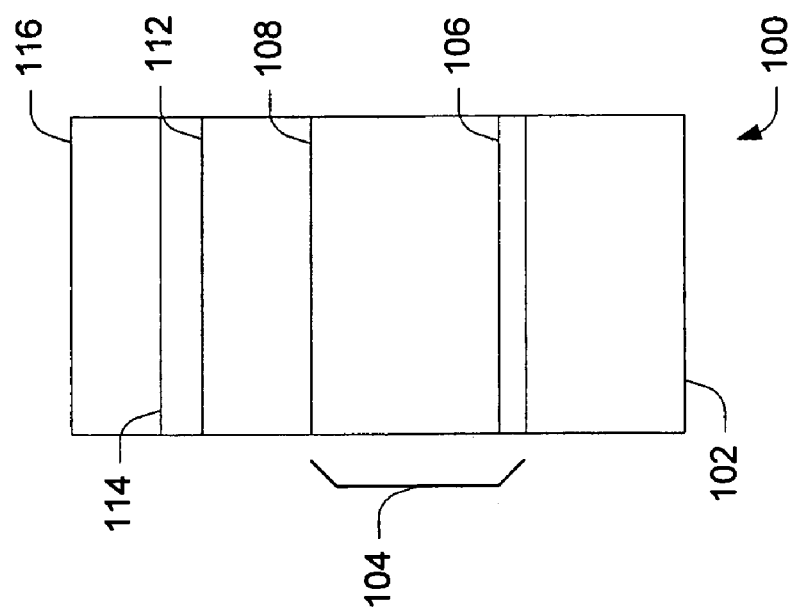
FIG. 4 is a side sectional view of the FIG. 1 substrate in process in accordance with one embodiment.

Referring to FIG. 4, another embodiment is shown. Here, substrate 100 includes a resistive buffer 104 that is formed as described above. Accordingly, the resistive buffer includes nucleation layer 106 and an overlying AlSb buffer layer 108. In this example, however, a bottom barrier layer 112 with larger lattice constant compared with the channel layer is grown over buffer layer 108. In this particular example, the bottom barrier layer 112 comprises InAlSb and is formed by opening, in the reactor, a source of In, Al and Sb under conditions effective to form the layer. In this particular example, a temperature range from between about 400° C. to 600° C. can be used. In at least one embodiment, a temperature of about 570° C. was used for the AlSb buffer layer and 430° C. was used for the bottom InAlSb barrier layer 112.

After the formation of the bottom barrier (InAlSb) 112 on top of barrier layer 104, the temperature in the reactor is lowered and a quantum well layer 114 is grown. In another embodiment, the bottom barrier 112, quantum well (InSb)

114, and upper barrier 116 are formed at the growth temperature in the range of 385° C. to 475° C. In an alternative embodiment, bottom barrier, QW and upper barriers are grown at different temperatures. Since the QW is a lower bandgap material InSb, the growth temperature is lower for this layer in order to maintain the higher compressive strain provided by the two barriers. In the illustrated and described embodiment, the quantum well layer comprises a strained InSb layer that is grown at a temperature of about 430° C.

Once this QW layer is grown, a top barrier layer, $In_xAl_{1-x}Sb$ (x=0-0.9) 116 is grown over the quantum well layer. In one particular example, top barrier layer 116 comprises InAlSb which is grown at a temperature of about 445° C. and the Al composition is about 20%.

In particular embodiments, the lower barrier layer 112 and upper barrier layer 116 are comprised of a material having a wider band gap than the quantum well layer 114, thereby confining a majority of charge carriers within the quantum well layer 114 for reduced device leakage Specifically, in one embodiment the barrier layers 112 and 116 are comprised of aluminum indium antimonide, $Al_xIn_{1-x}Sb$, where x is between approximately 0.1 and 1.0, and the quantum well layer 114 is comprised of InSb. In certain embodiments, the quantum well layer 114 is strained. In one embodiment the barrier layers 112 and 116 have the same composition. In another embodiment upper barrier layer 116 has a wider band gap than lower barrier layer 112. In a specific embodiment the barrier layers 112 and 116 may be graded.

Collectively, layers 112, 114 and 116 constitute a device structure or stack relative to which InSb-based devices can be formed. In practice, this device stack can have one or more intervening layers there between when a device is formed.

As but one example of how the resistive buffer 104 and an exemplary device stack can be incorporated into an InSb-based device, consider the following in connection with FIG. 5.

There, a substrate is shown generally at 100 and includes, as noted above, a silicon substrate 102. In addition, substrate 102 includes a resistive buffer 104 comprising a nucleation layer 106 and a buffer layer 108 as described above.

Further, in this example, a device stack is supported over the resistive buffer 104 and includes a bottom barrier layer 112, a quantum well layer 114 and a top barrier layer 116 formed as described above. In this particular example, a spacer layer 118 is formed between the bottom and top barrier layers 112, 116 respectively. In this example, the spacer layer comprises an InAlSb layer. In addition, spacer layer 118 has an overlying Te delta doped layer 120. The spacer layer 118 separates the Te dopant and the two-dimensional electron gas (2DEG) formed inside the InSb QW 112 and minimizes the electron scattering between electrons inside the channel and the Te dopants, thereby increasing the channel electron mobility. The thickness of the spacer layer 118 is in the range of 30-100 A. The larger the thickness of this layer, the lower the channel mobility due to lower carrier transfer from the Te delta-doped layer 120 to the channel through the spacer layer 118.

The upper barrier 116 of the same Al composition in the spacer layer 118 is grown on top of Te delta-doped layer 120 to form gate material for transistor fabrication. Depending on the thickness of this upper barrier 116, either depletion mode or enhancement mode field effect transistors can be fabricated. Enhancement mode quantum well based field effect transistors can be fabricated using a lower upper barrier thickness as compared with depletion mode devices, where the gate metal electrode is situated on top of a thicker upper barrier.

A quantum well based metal-insulator semiconductor field effect transistor (MISFET) is formed over the resistive buffer 104 that includes a metal gate electrode 122, a dielectric layer 124 and source and drain regions 126, 128 respectively for high-speed and low power applications.

Supporting Data

Figure 6:
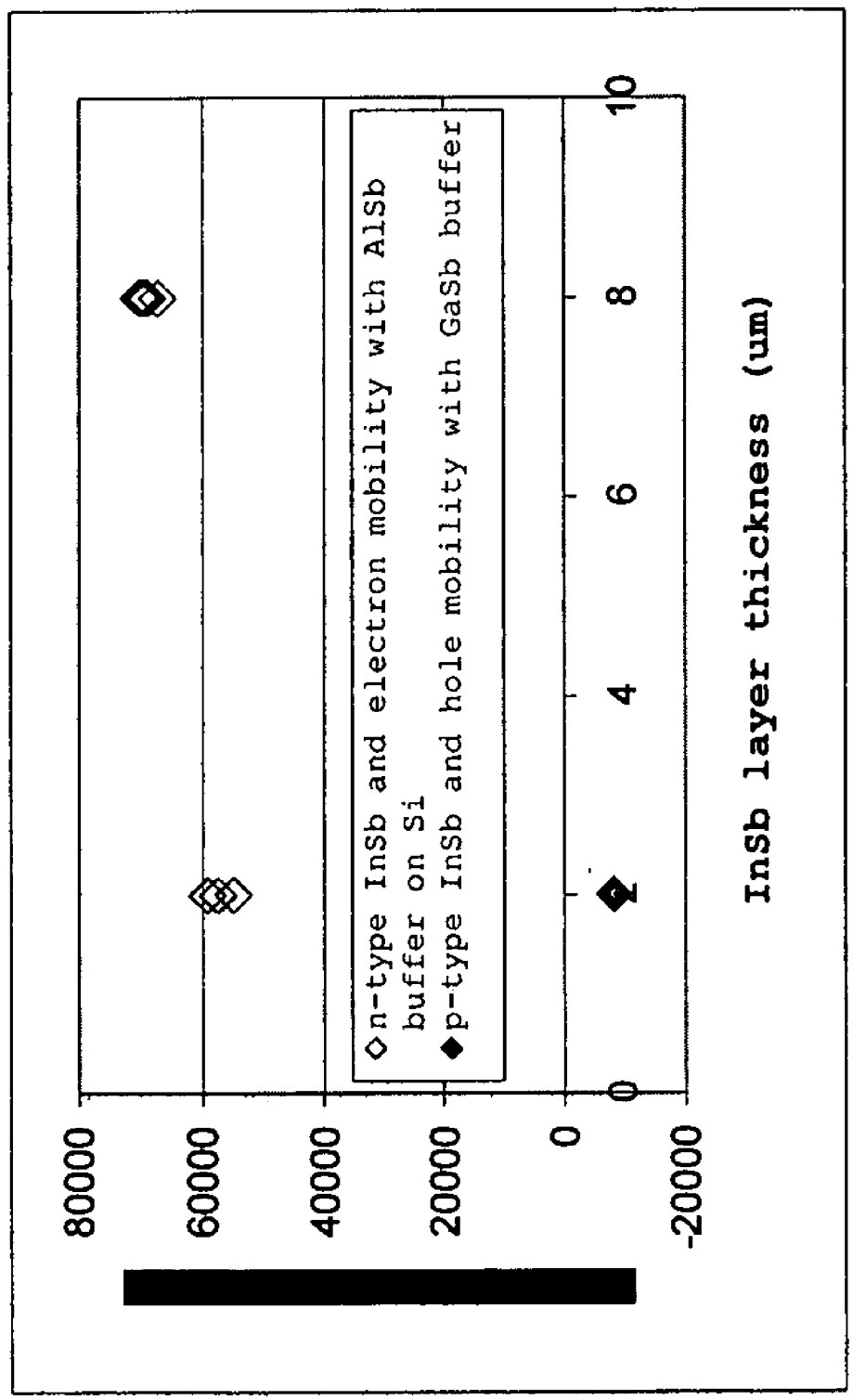
FIG. 6 is a graph that represents a graph of the Hall mobility versus the layer thickness of a InSb thin film layer in connection with two different buffer layers in accordance with one embodiment.

FIG. 6 is a graph that represents a graph of the Hall electron mobility ($cm^2 V^{-1}s^{-1}$) versus the layer thickness of a InSb thin film layer in connection with two different buffer layers—one of AlSb and one of GaSb. It should be noted that in order to provide device isolation, the bandgap of the buffer should be around 1.4 eV.

Figure 7:
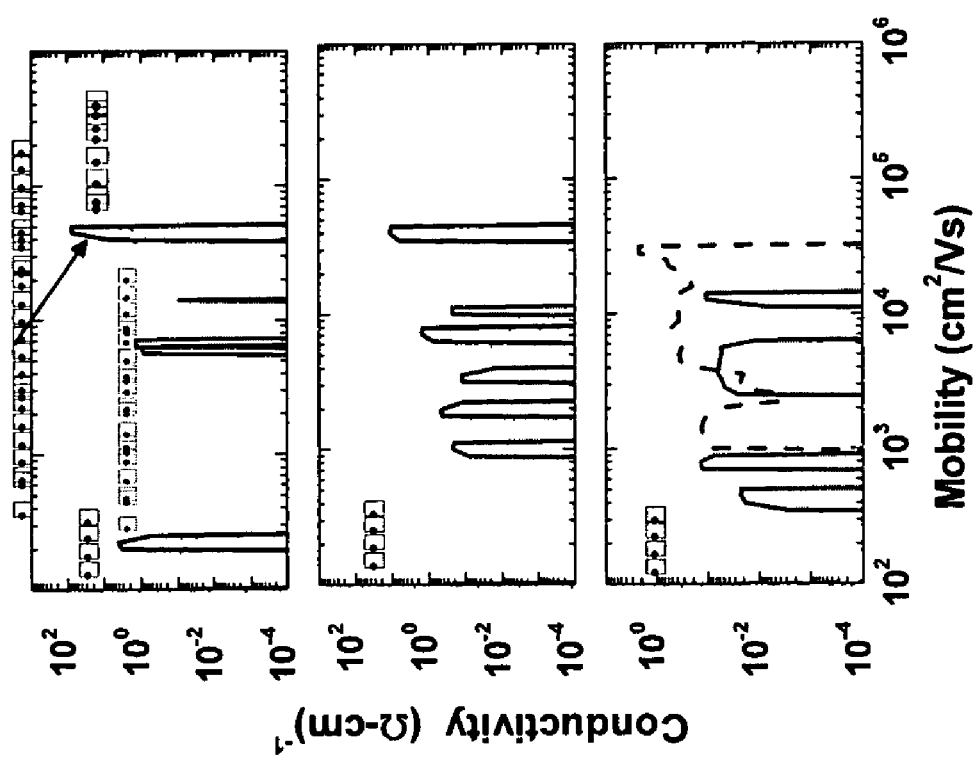
FIG. 7 is a quantitative mobility spectrum analysis of InSb film grown on silicon using an AlSb device isolation layer in accordance with one embodiment.

FIG. 7 shows a representative quantitative mobility spectrum analysis of InSb film grown on silicon using an AlSb device isolation layer. One can ascertain from the figure that the mobility of InSb film is about 48,000 $cm^2$Nsc at 300K with the highest conductivity peak due to the InSb film and the device isolation due to AlSb buffer layer. Conductivity from the InSb film is significantly higher than AlSb film.

Exemplary Method

Figure 8:
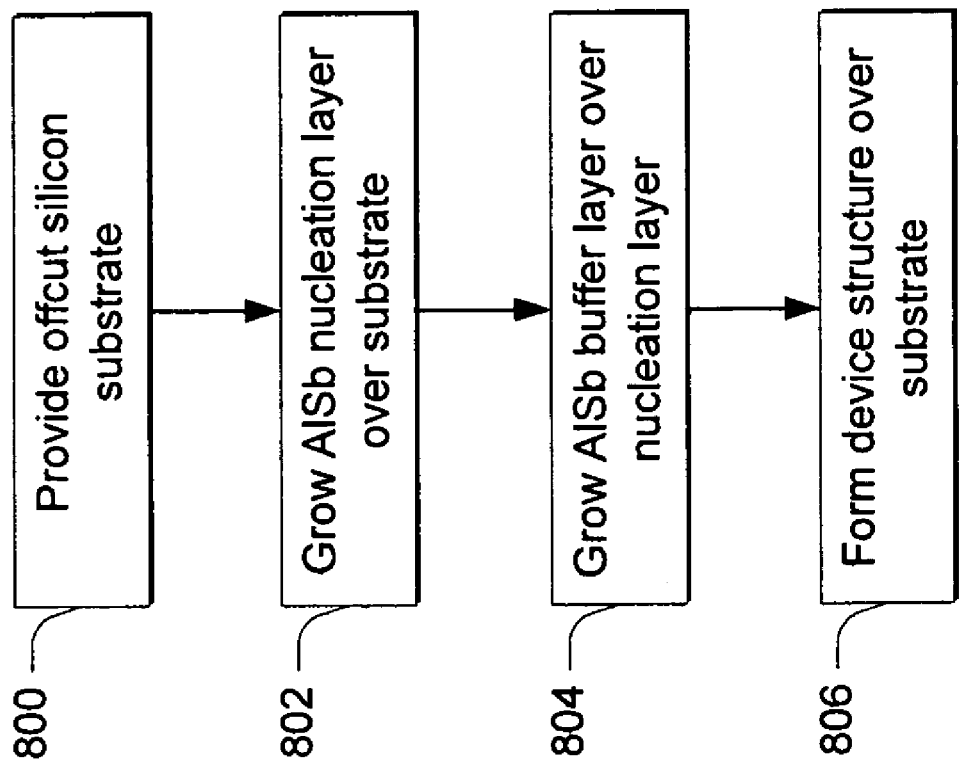
FIG. 8 is a flow diagram that describes acts in a method in accordance with one embodiment.

FIG. 8 is a flow diagram that describes acts in a method in accordance with one embodiment.

Act 800 provides an offcut silicon substrate and act 802 grows an AlSb nucleation layer over the substrate. Examples of how this can be done are provided above. Act 804 grows an AlSb buffer layer over the nucleation layer. Examples of how this can be done are provided above.

Act 806 forms a device structure over the substrate. Examples of how this can be done are provided above.

It is to be appreciated and understood that the claimed subject matter is not to be limited to any one particular type of device structure that is illustrated and described. Rather, other device structures can be utilized without departing from the spirit and scope of the claimed subject matter.

Exemplary System

Figure 9:
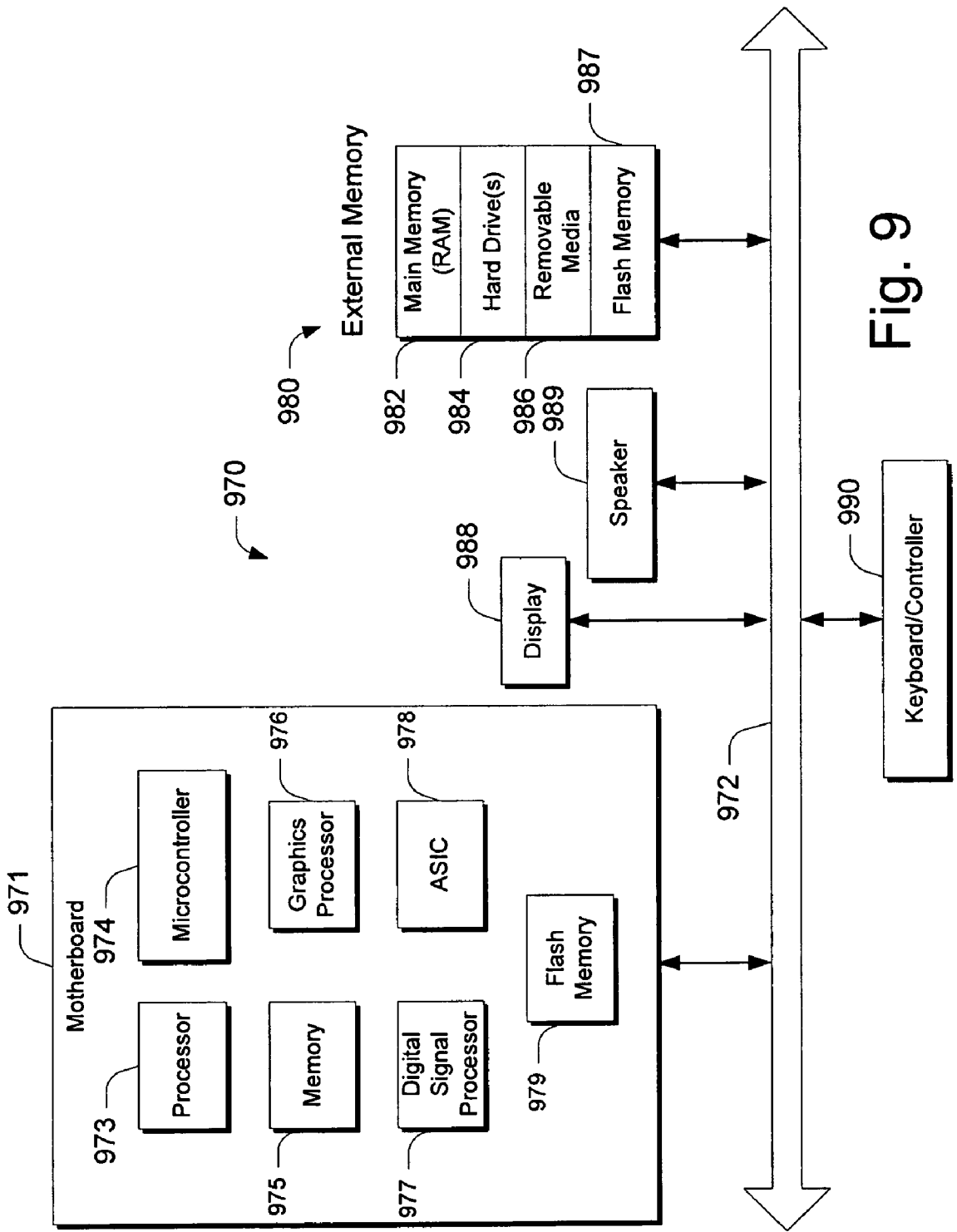
FIG. 9 is a block diagram of a system in accordance with one embodiment.

Referring to FIG. 9, a block diagram of an exemplary electronic system that can include transistors such as those described above is shown generally at 970. Such electronic system can comprise a computer system that includes a motherboard 971 which is electrically coupled to various components in electronic system 970 via a system bus 972. System bus 972 may be a single bus or any combination of busses.

Motherboard 971 can include, among other components, one or more processors 973, a microcontroller 974, memory 975, a graphics processor 976 or a digital signal processor 977, and/or a custom circuit or an application-specific integrated circuit 978, such as a communications circuit for use in wireless devices such as cellular telephones, pagers, portable computers, two-way radios, and similar electronic systems and a flash memory device 979.

The electronic system 970 may also include an external memory 980 that in turn includes one or more memory elements suitable to the particular application, such as a main memory 982 in the form of random access memory (RAM), one or more hard drives 984, and/or one or more drives that handle removable media 986, such as floppy diskettes, compact disks (CDs) and digital video disks (DVDs). In addition, such external memory may also include a flash memory device 987.

The electronic system 970 may also include a display device 988, a speaker 989, and a controller 990, such as a keyboard, mouse, trackball, game controller, microphone, voice-recognition device, or any other device that inputs information into the electronic system 970.

CONCLUSION

Various embodiments provide a buffer layer that is grown over a silicon substrate that provides desirable device isolation for devices formed relative to III-V material device layers, such as InSb-based devices, as well as bulk thin film grown on a silicon substrate. In addition, the buffer layer can mitigate parallel conduction issues between transistor devices and the silicon substrate. In addition, the buffer layer addresses and mitigates lattice mismatches between the film relative to which the transistor is formed and the silicon substrate.

Although the embodiments have been described in language specific to structural features and/or methodological acts, it is to be understood that the subject matter defined in the appended claims is not necessarily limited to the specific features or acts described. Rather, the specific features and acts are disclosed as exemplary forms of implementing the claimed subject matter.

What is claimed is:

1. A method comprising:
   growing a III-V material buffer layer over an offcut silicon substrate; and
   forming a III-V material-based structure over the III-V material buffer layer,
   wherein the buffer layer comprises AlSb and the III-V material-based structure comprises an InSb-based structure, and wherein the silicon substrate has a degree of offcut from between about 2 to 12 degrees and an index plan selected from a group of index plans comprising (211), (511), (711) or (013).

2. The method of claim 1, wherein the silicon substrate has a degree of offcut of 6 degrees.

3. The method of claim 1, wherein the silicon substrate comprises a (100) silicon crystal substrate.

4. The method of claim 1 further comprising prior to growing said buffer layer, growing a nucleation layer over the substrate.

5. The method of claim 1 further comprising prior to growing said buffer layer, growing a nucleation layer over the substrate, wherein the act of growing the nucleation layer comprises growing an AlSb nucleation layer.

6. The method of claim 1, wherein the act of forming a III-V material-based structure comprises forming one or more InSb-based transistors.

7. A method comprising:
   growing a buffer layer comprising AlSb over an offcut silicon substrate;
   growing a bottom barrier layer over the buffer layer;
   growing a quantum well layer over the bottom barrier layer;
   growing a top barrier layer over the quantum well layer; and
   forming an InSb-based device over the quantum well layer.

8. The method of claim 7, wherein the bottom barrier layer comprises InAlSb.

9. The method of claim 7, wherein the quantum well layer comprises a strained InSb layer.

10. The method of claim 7, wherein the top barrier layer comprises InAlSb.

11. The method of claim 7, wherein the InSb-based device comprises a transistor.

12. The method of claim 7, wherein the act of growing the bottom barrier comprises providing In, Al and Sb in a reactor under temperature conditions from between about 400° C. to 600° C.

13. The method of claim 7, wherein the offcut silicon substrate has a degree of offcut from between about 2 to 12 degrees.

14. The method of claim 7, wherein the silicon substrate has a degree of offcut of 6 degrees.

15. The method of claim 7, wherein the silicon substrate comprises a (100) silicon crystal substrate.

* * * * *